(12) United States Patent
Wang et al.

(10) Patent No.: US 11,333,713 B2
(45) Date of Patent: May 17, 2022

(54) VOLTAGE SAMPLING CIRCUIT AND METHOD FOR SAMPLING VOLTAGE

(71) Applicant: Globe (Jiangsu) Co., Ltd, Jiangsu (CN)

(72) Inventors: Huage Wang, Jiangsu (CN); Baoan Li, Jiangsu (CN); Chuanjun Liu, Jiangsu (CN); Xian Zhuang, Jiangsu (CN)

(73) Assignee: Globe (Jiangsu) Co., Ltd, Changzhou (CN)

( * ) Notice: Subject to any disclaimer, the term of this patent is extended or adjusted under 35 U.S.C. 154(b) by 0 days.

(21) Appl. No.: 17/030,649

(22) Filed: Sep. 24, 2020

(65) Prior Publication Data
US 2021/0088597 A1  Mar. 25, 2021

(30) Foreign Application Priority Data

Sep. 24, 2019  (CN) .......................... 201910903444.9

(51) Int. Cl.
*G01R 31/396* (2019.01)
*G01R 31/3835* (2019.01)

(52) U.S. Cl.
CPC ....... *G01R 31/396* (2019.01); *G01R 31/3835* (2019.01)

(58) Field of Classification Search
CPC .......................... G01R 31/396; G01R 31/3835
See application file for complete search history.

(56) References Cited

U.S. PATENT DOCUMENTS

| 7,952,327 | B2* | 5/2011 | Kudo ..................... G01R 31/52 320/116 |
| 8,130,000 | B2* | 3/2012 | Botker ................. G01R 31/396 324/433 |
| 9,217,778 | B2* | 12/2015 | Shimomura ....... G01R 31/3835 |
| 2005/0116686 | A1 | 6/2005 | Odaohhara |
| 2011/0121837 | A1 | 5/2011 | Kim et al. |

FOREIGN PATENT DOCUMENTS

| CN | 102114788 A | 7/2011 |
| CN | 110146824 A | 8/2019 |
| CN | 110148987 A | 8/2019 |
| WO | 2018098628 A1 | 6/2018 |

OTHER PUBLICATIONS

Extended Search Report of Counterpart European Patent Application No. 20198033.1 dated Feb. 24, 2021.

* cited by examiner

*Primary Examiner* — Walter L Lindsay, Jr.
*Assistant Examiner* — Milton Gonzalez

(57) ABSTRACT

A voltage sampling circuit is provided for sampling voltage of at least two sets of cells in a battery pack includes at least two analog front ends including a low-side analog front end connected to a first set of cells and a high-side analog front end connected to a second set of cells, a subtractor has a positive input end and a negative input end, the positive input end connecting to the output of the high-side analog front end for receiving the analog voltage output by the high-side analog front end. When the first set of cells is connected with the second set of cells in series, the negative input end of the subtractor connecting to the total positive the first set of cells, when the first set of cells is connected with the second set of cells in parallel, the negative input end of the subtractor is grounded.

10 Claims, 5 Drawing Sheets

VOLTAGE SAMPLING CIRCUIT AND METHOD FOR SAMPLING VOLTAGE

CROSS-REFERENCE TO RELATED INVENTION

This invention is a U.S. application which claims the priority of CN application Serial No. 201910903444.9, filed on Sep. 24, 2019, the disclosures of which are hereby incorporated by reference in their entirety.

TECHNICAL FIELD

The present invention relates to a voltage sampling circuit and a method for sampling voltage, which belongs to a field of battery management.

BACKGROUND ART

Usually, in order to expand the versatility of the battery pack, it employs two sets of battery cells connected in series or in parallel to form dual-voltage battery pack (the rated voltage of every set of cells is N) to provide two different voltage for power tools. When the two sets of cells are connected in parallel, the output voltage is low voltage N; when the two sets of cells are connected in series, the output voltage is high voltage 2 N.

Because the battery pack needs to provide different voltage to power the electric power tool, two analog front-end AFEs are needed to manage the two sets of cells separately. Usually the AFE with ADC module is much expensive than the AFE with no ADC. But when the AFE has no ADC module, the high voltage cannot be detected.

Hence, there is a need to improve the conventional voltage sampling circuit and the method for sampling the voltage to resolve the above problems.

SUMMARY OF INVENTION

The present invention provides a voltage sampling circuit, the voltage sampling circuit can sample the voltage of at least two sets of cells, the sampling circuit has at least two analog font ends having no ADC module. Therefor the cost of the circuit is reduced.

In order achieve above-mentioned objectives, the present invention provides a voltage sampling circuit for sampling the voltage of at least two sets of cells in a battery pack, the voltage sampling circuit comprises: at least two analog front ends comprising a low-side analog front end connected to a first set of cells and a high-side analog front end connected to a second set of cells, a subtractor for obtaining the analog voltage of the second set of cells connected to the high-side analog front end with respect to ground including a positive input end and a negative input end, the positive input end connecting to the output of the high-side analog front end for receiving the analog voltage output by the high-side analog front end, when the first set of cells is connected with the second set of cells in series, the negative input end of the subtractor connecting to the total positive the first set of cells, when the first set of cells is connected with the second set of cells in parallel, the negative input end of the subtractor is grounded.

As an improvement of the present invention, the voltage sampling circuit comprises a switch control circuit, the switch control circuit includes a first switch connecting the total positive of the first set of cells with the negative input end of the subtractor when the first set of cells and the second set of cells are connected in series, and a second switch connecting the negative input end of the subtractor with the ground when the first set of cells is connected in parallel with the second set of cells.

As an improvement of the present invention, one end of the first switch connects with the total positive of the first set of cells and the other end of the first switch connects with the negative input end of the subtractor, one end of the second switch connects with the negative input end of the subtractor and the other end of the second switch connects is grounded, the first switch is closed and the second switch is opened when the first set of cells and the second set of cells are connected in series, the first switch is opened and the second switch is closed when the first set of cells and the second set of cells are connected in parallel.

As an improvement of the present invention, the voltage sampling circuit further comprises a microcontroller respectively connected to the output of the low-side analog front end and the output of the subtractor to receive the sampled analog voltage, the first switch and the second switch are controlled by the microcontroller according to the series or parallel connection between the first set of cells and the second set of cells.

As an improvement of the present invention, the voltage sampling circuit further comprises a communication isolation circuit connecting a communication interface of the high-side analog front end to a communication interface of the microcontroller, wherein the communication isolation circuit communicates with the microcontroller through a second communication channel.

As an improvement of the present invention, the low-side analog front end communicates with the microcontroller through a first communication channel.

As an improvement of the present invention, the voltage sample circuit comprises a total voltage sampling circuit, the total voltage sampling circuit is used for sampling the total voltage of at least two sets of cells in the battery pack, so as to judge whether the at least two sets of cells are connected in series or in parallel according to the sampling total voltage.

As an improvement of the present invention, at least three control switches are arranged between the first set of cells and the second set of cells to control the first set of cells and the second set of cells in series connection or in parallel connection.

In order achieve above-mentioned objectives, the present invention also provides a method for sampling voltage, providing a voltage sampling circuit, the voltage sampling circuit comprises: at least two analog front ends comprising a low-side analog front end connected to a first set of cells and a high-side analog front end connected to a second set of cells, a subtractor for obtaining the analog voltage of the second set of cells connected to the high-side analog front end with respect to ground including a positive input end and a negative input end, the positive input end connecting to the output of the high-side analog front end for receiving the analog voltage output by the high-side analog front end, when the first set of cells is connected with the second set of cells in series, the negative input end of the subtractor connecting to the total positive the first set of cells, when the first set of cells is connected with the second set of cells in parallel, the negative input end of the subtractor is grounded.

The above general description and the following detailed description are intended to be illustrative and not restrictive.

DETAILED DESCRIPTION

Figure 1:
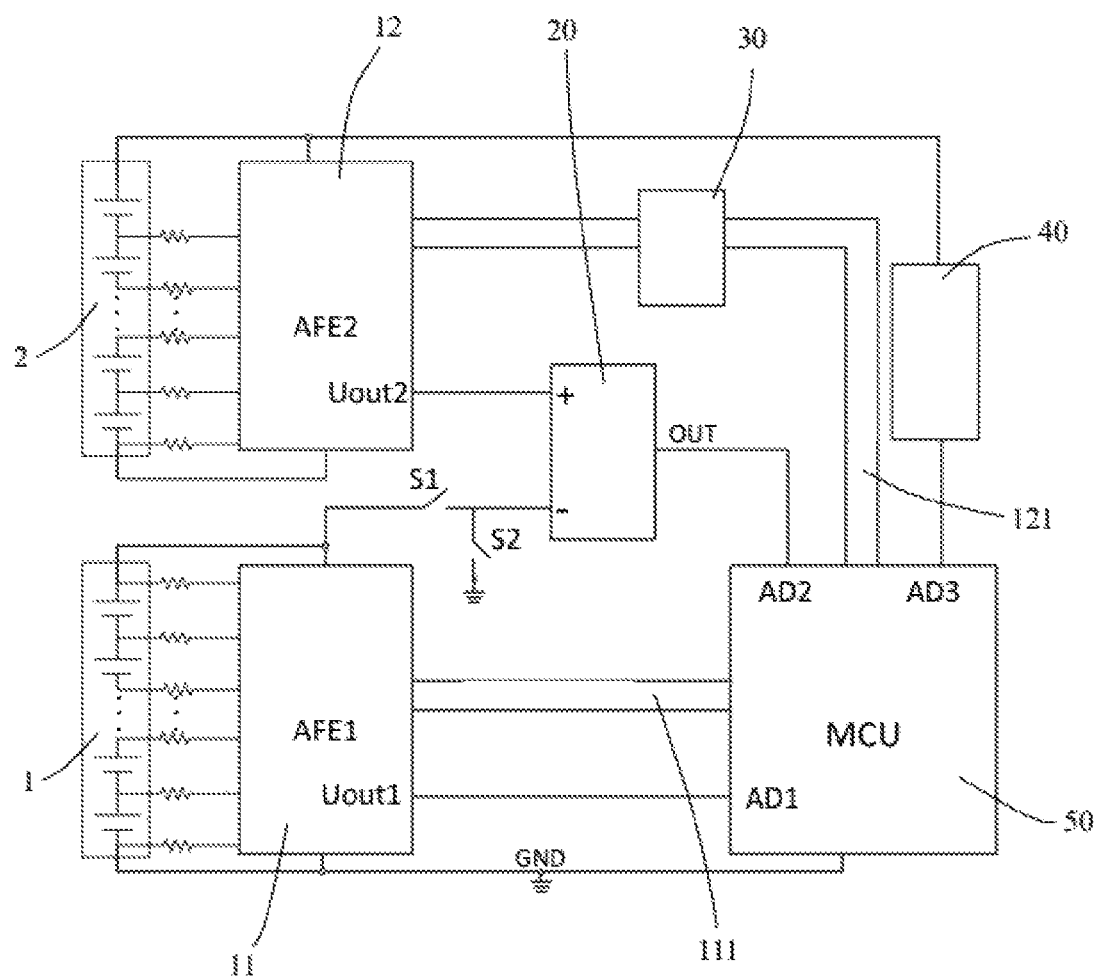
FIG. 1 is a schematic diagram showing a voltage sampling circuit according to a first embodiment of the present invention.

The exemplary embodiment will be described in detail herein, and the embodiment is illustrated in the accompanying drawings. When the following description refers to the drawings, unless otherwise indicated, the same numbers in different drawings indicate the same or similar elements. The embodiment described in the following exemplary embodiment does not represent all embodiments consistent with present invention. On the contrary, they are only examples of devices, systems, machines and methods consistent with some aspects of the invention as detailed in the appended claims.

In current battery pack industry, in order to expand the versatility of the battery pack, it usually employs two sets of battery cells, which are connected in series or in parallel to provide two different voltage for power tools, among which the more common ones are 20V/40V battery pack, 24V/48V battery pack, and 40V/80V battery pack. Commonly, the two sets of cells are usually managed by two analog front ends (AFEs) respectively.

The communication can be achieved by directly connecting the communication interfaces of the analog front end AFE (hereinafter referred to as the low-side analog front end) and microcontroller (hereinafter referred to as MCU) without setting an isolation chip between thereof. The low-side analog front end shares the common-ground with the microcontroller unit (MCU). But, another AFE (hereinafter referred to as the high-side analog front end) needs to add a communication isolation chip between the high-side AFE and the MCU to communicate with the microcontroller unit (MCU). Nevertheless, the AFE has the analog-digital converter (hereinafter referred to as ADC module) can directly convert the sampled cell voltage into a digital quantity and send it to the MCU for processing through the communication interface. However, some AFEs do not integrate with ADC module and can only send the analog quantity of corresponding cells to the microcontroller for sampling. At the same time, the analog quantity of the low-side analog front end can be directly sent to the microcontroller for processing, and the analog quantity of the high-side analog front end cannot be sent to the microcontroller directly, otherwise the microcontroller will be damaged due to high voltage.

Commonly, the cost of the AFE that integrates the ADC module inside is higher than the cost of the AFE without integrating the ADC module inside. In order to reduce the cost, it usually employs the AFE without integrating the ADC module inside, but the problem needs to be resolve when the microcontroller samplings the analog quantity from the high-side analog front end.

In order to solve the above described problem, the present invention provides a voltage sampling circuit adapted for sampling the voltages from the at least two sets of cells in the battery pack. For the convenient purpose and clarity of description, the following will take two sets of cells as an example for detailed description, but it should not be limited to this.

Referring to FIG. 1, the voltage sampling circuit includes: an analog front end (AFE), a subtractor 20, a communication isolation circuit 30, a switch control circuit, a total voltage sampling circuit 40 and a microcontroller unit (MCU) 50.

The two sets of cells are defined respectively as a first set of cells 1 and a second set of cells 2, and a control switch is arranged between the first set of cells 1 and the second set of cells 2. The control switch is used to control the first set of cells 1 and the second set of cells 2 in series connection or in parallel connection. Preferably, in the present embodiment, the control switch is a mechanical switch.

The analog front end includes a low-side analog front end 11 connected to the first set of cells 1 through a first communication channel 111 and a high-side analog front end 12 connected to the second set of cells 2 through a second communication channel 121. The low-side analog front end 11 is used to sample the analog voltage from the first set of cells 1 with respect to the ground and transmit the analog voltage to the microcontroller 50. The high-side analog front end 12 is used to sample the analog voltage of the second set of cells 2 with respect to the ground and transmit it to the microcontroller 50.

Preferably, as the low-side analog front end 11 connects to the microcontroller 50 through the first communicate channel 111, the first communication channel 111 can be used to transmit instructions when the microcontroller 50 needs to sample the analog voltage relative to the ground of any battery cells in the first set of cells 1. After receiving such an instruction, the low-side analog front end 11 will quickly detect and extract the analog voltage value of the corresponding cell. In the meanwhile, an interface Uout1 of the low-side analog front end 11 is connects to an interface AD1 of the microcontroller 50, so that after the low-side analog front end 11 detects the analog voltage of the corresponding cell, it can be directly output to the microcontroller 50.

The communication isolation circuit 30 is connected between the high-side analog front end 12 and the microcontroller 50, and connects the communication interface of the high-side analog front end 12 with the communication interface of the microcontroller 50, thereby realizing the high-side analog front end 12 and the microcontroller 50 communicating therebetween. Preferably, the high-side analog front end 12, the communication isolation circuit 30 and the microcontroller 50 communicate through the second communication channel 121.

The subtractor 20 is used to obtain the analog voltage (i.e. the actual voltage) of the second set of cells 2 output by the high-side analog front end 12 with respect to the ground. Specifically, a positive input end of the subtractor 20 connects to an interface Uout2 of the high-side analog front end 12 to receive the voltage output from the high-side analog front end 12. A negative input end of the subtractor 20 can either connect with the total positive of the first set of cells 1 or connect to the ground. An output end OUT of the subtractor 20 connects with the interface AD2 of the microcontroller 50, to transmit the analog voltage (i.e. actual voltage) of the second set of cells 2 output by the subtractor 20 with respect to the ground to the microcontroller 50.

The total voltage sampling circuit 40 is connected between the second set of cells 2 and the microcontroller 50 and is used to sample and transmit the total voltages of the two sets of cells of the battery pack to the microcontroller 50. The microcontroller 50 firstly judges the first set of cells 1 and the second set of cells 2 in series connection or in parallel connection according to the received total voltages and then controls the operation of the switch control circuit. As can be understood, in other embodiments, the total voltage sampling circuit 40 may not be employed, and the first set of cells 1 and the second set of cells 2 can be manually arranged in series connection or in parallel connection, as long as it can be determined that the connection relationship between the first set of cells 1 and the second set of cells 2.

The switch control circuit includes a first switch S1 and a second switch S2. The first switch S1 connects the total positive of the first set of cells 1 with the subtractor 20, when the first set of cells 1 and the second set of cells 2 are in series connection. The second switch S2 connects the subtractor 20 with the ground (i.e. grounding the subtractor 20), when the first set of cells 1 and the second set of cells 2 are in parallel connection. Specifically, one end of the first switch S1 is connected to the total positive of the first set of cells 1, the other end is connected to the negative input end of the subtractor 20, and one end of the second switch S2 is connected to the negative input end of the subtractor 20 and the other end is grounded. When the first set of cells 1 and the second set of cells 2 are connected in series, the first switch S1 is closed and the second switch S2 is opened, and the positive input end of the subtractor 20 inputs the voltage output by the high-side analog front end 12 and the negative input end inputs the voltages of the first set of cells 1. At this time, the output end OUT of the subtractor 20 outputs the analog voltage of the second set of cells 2 relative to the ground, that is, the actual voltage; when the first set of cells 1 and the second set of cells 2 are connected in parallel, the first switch S1 is opened and the second switch S2 is closed, and the positive input end of the subtractor 20 inputs the voltage output by the high-side analog front end and the negative input end is grounded. At this time, the output end OUT of the subtractor 20 also outputs the analog voltage of the second set of cells 2 relative to the ground, that is, the actual voltage.

Figure 2:
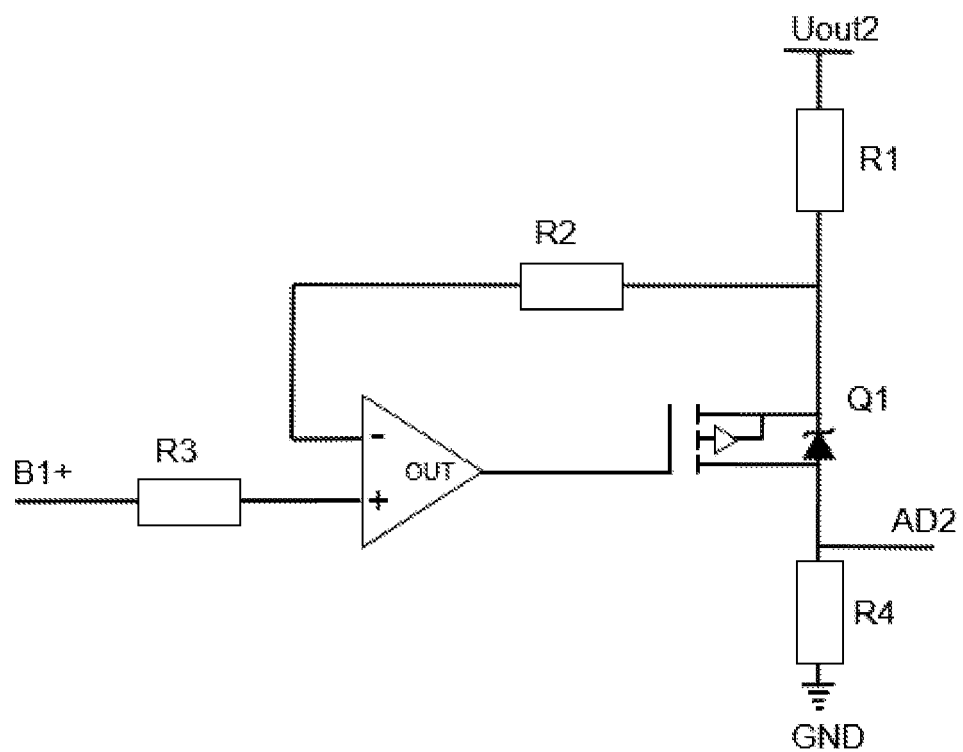
FIG. 2 is an internal circuit diagram of a subtractor shown in FIG. 1.

Referring to FIG. 2, when the first set of cells 1 and the second set of cells 2 are connected in series and the high-side analog front end 12 is referenced to ground (GND), the output value of the interface Uout2 is the voltage value when the reference is GND, therefore, by subtracting the total voltage of the first set of cells 1 from the voltage output by the high-side analog front end 12, the actual voltage of the detected second group of cells 2 can be obtained. When taking GND as a reference, the output voltage value of the interface Uout2 is relatively high. If directly inputting the voltage into the microcontroller 50, it will damage the microcontroller 50 (beyond the allowable range of the microcontroller), so that the subtractor 20 is used to subtract the total voltage of the first set of cells 1, and the actual voltage of the detected second set of cells 2 can be obtained. The value is small and can be input to the microcontroller 50.

It should be noted that in the case of series connection, taking GND as a reference, the voltage value output by the low-side analog front end 11 is the actual voltage value of the detected first set of cells 1, while the voltage value output by the high-side analog front end 12 is the value superimposing the actual voltage value of the detected second set of cells 2 on the voltage of the first set of cells 1. Therefore, in order to get the real detected voltage value of the second set of cells 2, it needs to subtract the total voltage of the first set of cells 1 through the subtractor 20.

In the case of the parallel connection between the first set of cells 1 and the second set of cells 2, the voltage output by the high-side analog front end 12 is the real voltage value of the second set of cells 2, so that grounding the negative input end of the subtractor 20, the actual voltage of the second set of cells 2 can be directly obtained. The value is small and can be directly input to the microcontroller 50.

Opening or closing of the first switch S1 and the second switch S2 is controlled by the microcontroller 50. That is, if judging that the first set of cells 1 and the second set of cells 2 are connected in series, the microcontroller 50 controls the first switch S1 to close and the second switch S2 to open; if judging that the first set of cells 1 and the second set of cells are connected in parallel, the microcontroller 50 controls the first switch S1 to open and the second switch S2 to close.

The method of sampling voltage of the present invention mainly comprises following steps:

Providing an analog front end, and defining a low-side analog front end 11 connecting to a first set of cells 1 of the at least two sets of cells and a high-side analog front end 12 connecting to a second set of cells 2;

Providing a subtractor 20, and connecting a positive input end of the subtractor 20 with an output end of the high-side analog front end 12;

Connecting a negative input end of the subtractor 20 with the total positive of the first set cells 1 and inputting the voltage by the first set cells 1, when the first set of cells 1 connects with the second set of cells 2 in series; grounding the negative input end of the subtractor 20 when the first set of cells 1 connects with second set of cells 2 in parallel.

Figure 3:
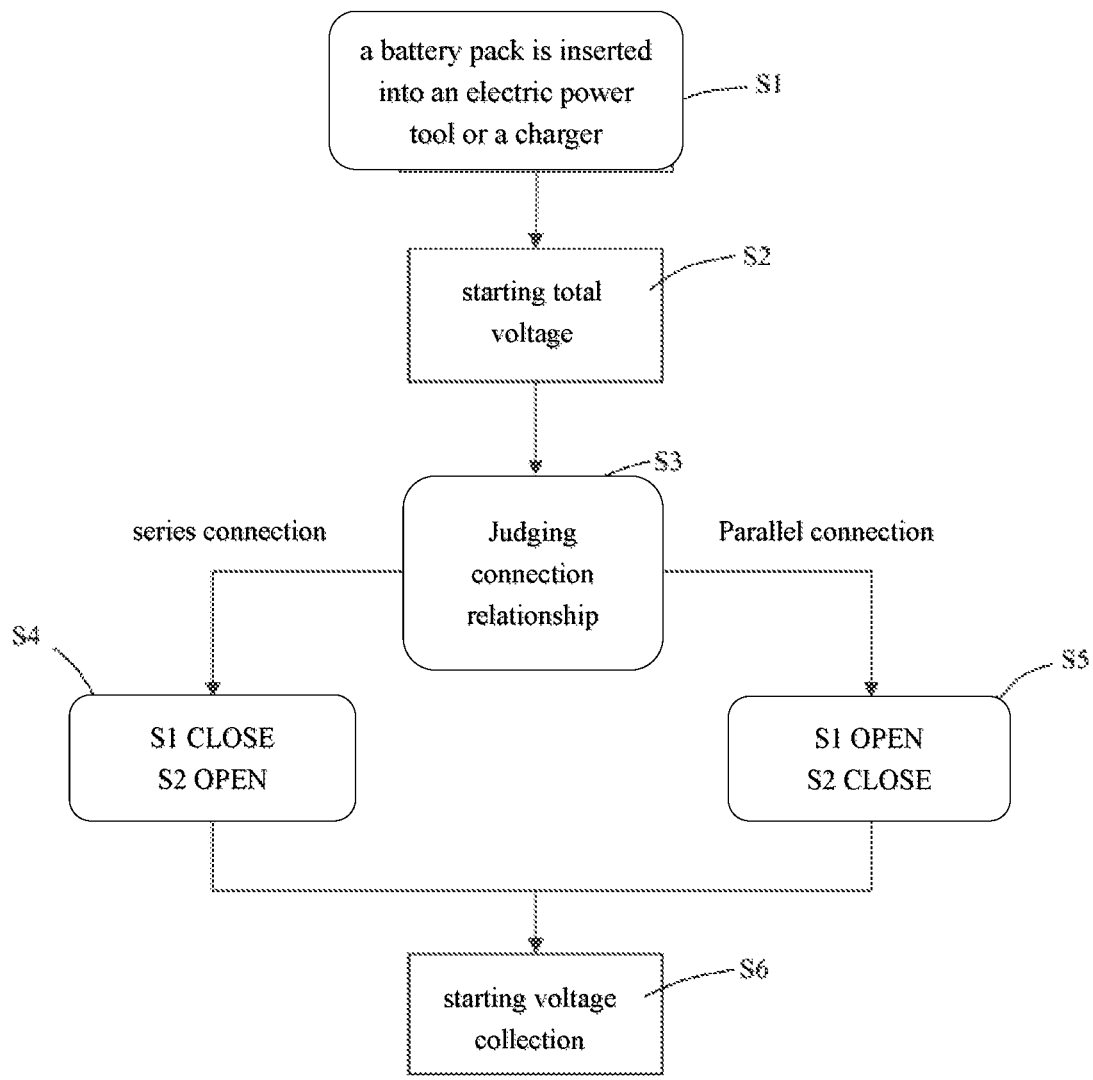
FIG. 3 is a flowchart of a method applying the voltage sampling circuit shown in FIG. 1.

Referring to FIG. 3, the method of sampling voltage specifically incudes following steps:

S1, a battery pack is inserted into an electric power tool or a charger;

S2, starting total voltage sampling: after awakening the battery pack, the microcontroller 50 controls the total voltage sampling circuit 40 to work, and sampling the total voltage of the two sets of cells in the battery pack through the interface AD3;

S3, judging the series relationship or the parallel relationship (ie. series connection or the parallel connection) between the two sets of cells according to the sampled total voltage, if it is the series connection, then jump to S4, if it is the parallel connection, then jump to S5;

S4, the microcontroller 50 controls the first switch S1 to close and the second switch S2 to open;

S5, the microcontroller 50 controls the first switch S1 to open and the second switch S2 to close;

S6, staring voltage sampling: the microcontroller 50 starts the first communication channel 111, and samples the analog voltage (ie. actual voltage) relative to the ground of the first set of cells 1 through the low-side analog front end 11 and the analog voltage is sent to the interface AD1 of the microcontroller through Vout1 of the low-side analog front end 11; at the same time, the microcontroller 50 starts the second communication channel 121, and samples the analog voltage (ie. actual voltage) relative to the ground of the second set of cells 2 through the high-side analog front end 12, the analog voltage of the second set of cells 2 is sent to the interface AD2 of the microcontroller after being subtracted by the subtractor 20;

S7, repeating S6 until the voltage of all cells are sampled.

It should be noted that the voltage sampling by the present invention is the actual voltage of each cell (including the first set of cells 1 and the second set of cells 2), while not the total voltage of the cell sets.

Figure 4:
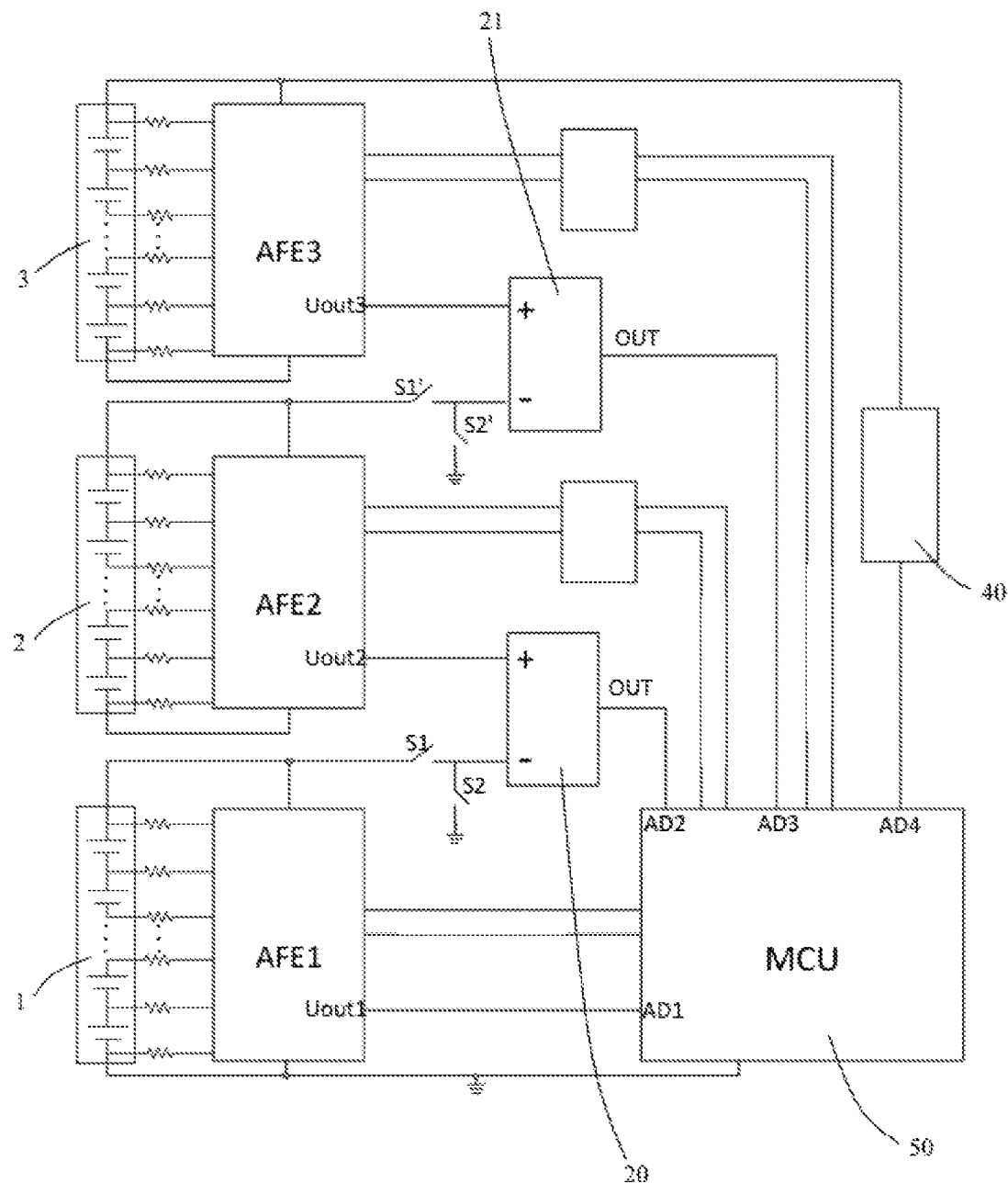
FIG. 4 is a schematic diagram showing the voltage sampling circuit in FIG. 1 which is used with three groups of analog front ends AFEs and three sets of cells.

Referring to FIG. 4, the voltage sampling circuit of the present invention is not only applicable for the case of two groups of analog front-end AFEs, but also applicable for the case of three or more groups of analog front-end AFEs.

When the voltage sampling device of the present invention is applied to three groups of analog front-end AFEs, the voltage sampling method of the first set of cells 1 and the second set of cells 2 is the same as shown in FIG. 1-FIG. 3, which will not be described in detail here.

Similarly, as for the third set of cells 3, when the first set of cells 1, the second set of cells 2, the third set of cells 3 connected to each other in series, the third switch S1' is closed, the second switch ST is opened/disconnected. At this time, the positive input end of the second subtractor 21 inputs the voltage output by the Uout3 of the analog front end AFE3, and the negative input end inputs the voltages of the first set of cells 1 and the second set of cells 2, and the output end OUT of the second subtractor 21 outputs the analog voltage relative to the ground of the third set of cells 2, which is the real voltage subtracting the voltages of the first set of cells 1 and the second set of cells 2. At this time, the first switch S1 is closed and second switch S2 is opened. When the first set of cells 1, the second set of cells 2 and the third set of cells 3 are connected parallelly, the third switch S1' is off/opened and the second switch S2' is closed, at this time, the positive input end of the second subtractor 21 inputs the voltage output by the analog front end AFE3, and the negative input end is grounded. The output end OUT of the second subtractor 21 outputs the analog voltage of the third set of cells 3 relative to ground, which is the actual voltage.

Similarly, when the voltage sampling circuit of the present invention is applied to four sets of analog front end AFEs, three subtractors can be used to sample the analog voltage relative to the ground of the cells connected to the corresponding high-side analog front end, and the analog voltage can be safely transmitted to the microcontroller 50, which will not be described in detail here.

Figure 5:
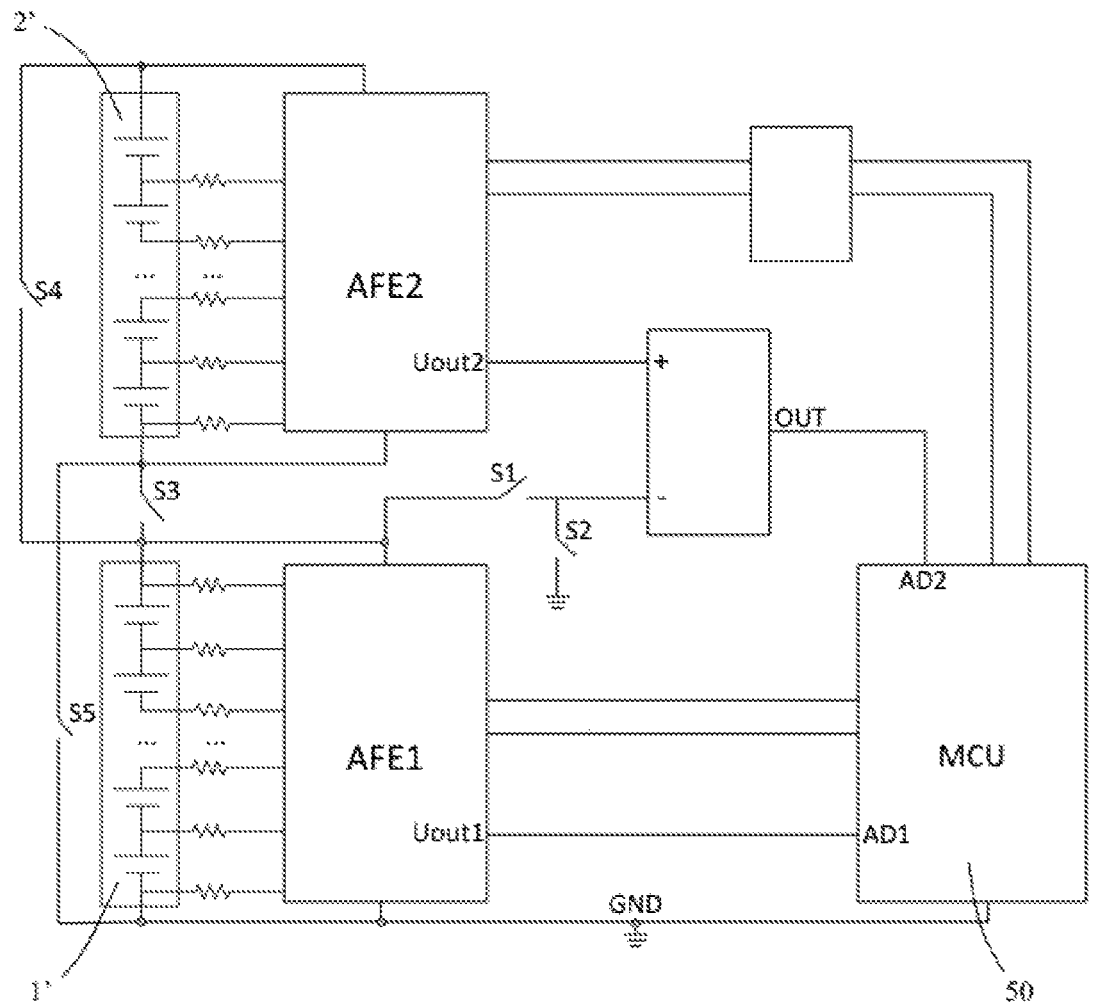
FIG. 5 is a schematic structural diagram showing a voltage sampling circuit according to a second embodiment of the present invention.

Referring to FIG. 5, a second embodiment of the voltage sampling circuit of the present invention is shown. In this embodiment, the control switch arranged between the first set of cells 1' and the second set of cells 2' are electronic switches S3, S4, S5, which therefore can be used to control the first set of cells 1' and the second set of cells 2' in series connection or in parallel connection.

Specifically, when the first set of cells 1' and the second set of cells 2' need to be connected in series, the microcontroller 50 controls the electronic switch S3 closed and the electronic switches S4 and S5 opened, and the analog voltage of the cells in the first set of cells 1' and the second set of cells 2' is sampled. When the first set of cells 1' and the second set of cells 2' are connected in parallel, the microcontroller 50 controls the electronic switches S4 and S5 closed and the electronic switch S3 opened, and the analog voltage of the cells in the first set of cells 1' and the second set of cells 2' is sampled.

As for the method of voltage sampling from the first set cells 1' and the second set of cells 2', it can be referred to FIGS. 1 to 3, which will not be described in detail here.

As in a whole, the present invention firstly determines the series/parallel connections between the two sets of cells according to the total voltage, and then adjusts the input of the negative input end of the subtractor 20 by switching the switches S1 and S2, so that a real voltage of the detected cells can be achieved through the subtractor 20, regardless of whether in series or in a parallel connection. It can be seen that the present invention employs the switches and the subtractor 20 which makes the output end of the subtractor 20 output the real voltage input by high-side analog front end 12 connected to the detected cells. No ADC module is needed to be integrated in the analog front end AFE, therefore, the cost is reduced.

To summarize, the voltage sampling circuit of the present invention employs the subtractor 20 for subtracting the total voltages of the first set of cells 1 from the voltage output by the high-side analog front end 12 when the at least two sets of cells are connected to each other in series, so as to sample the analog voltage of the second set of cells relative to the ground. The voltage sampling circuit of the present invention employs the subtractor 20 to ground the negative input end of the subtractor 20 to thereby obtain the analog voltage relative to the ground when the at least two sets of cells are connected to each other in parallel, so as to sample the analog voltage of the second set of cells relative to the ground. Hence, the microcontroller avoids be damaged due to high voltage.

It is to be understood, however, that even though numerous characteristics and advantages of preferred and exemplary embodiments have been set out in the foregoing description, together with details of the structures and functions of the embodiments, the disclosure is illustrative only; and that changes may be made in detail within the principles of present disclosure to the full extent indicated by the broadest general meaning of the terms in which the appended claims are expressed.

What is claimed is:

1. A voltage sampling circuit for sampling the voltage of at least two sets of cells in a battery pack, the voltage sampling circuit comprises:
    at least two analog front ends comprising a low-side analog front end connected to a first set of cells and a high-side analog front end connected to a second set of cells;
    a subtractor for obtaining the analog voltage of the second set of cells connected to the high-side analog front end with respect to ground including:
        a positive input end connected to the output of the high-side analog front end for receiving the analog voltage output by the high-side analog front end; and
        a negative input end connected to a total positive of the first set of cells when the first set of cells is connected with the second set of cells in series, and grounded when the first set of cells is connected with the second set of cells in parallel.

2. The voltage sampling circuit as claimed in claim 1, further comprises a switch control circuit, the switch control circuit includes a first switch connecting the total positive of the first set of cells with the negative input end of the subtractor when the first set of cells and the second set of cells are connected in series, and a second switch connecting the negative input end of the subtractor with the ground when the first set of cells is connected in parallel with the second set of cells.

3. The voltage sampling circuit as claimed in claim 2, wherein one end of the first switch connects with the total positive of the first set of cells and the other end of the first switch connects with the negative input end of the subtractor, one end of the second switch connects with the negative input end of the subtractor and the other end of the second switch connects is grounded, the first switch is closed and the second switch is opened when the first set of cells and the second set of cells are connected in series, the first switch is opened and the second switch is closed when the first set of cells and the second set of cells are connected in parallel.

4. The voltage sampling circuit as claimed in claim 2, further comprises a microcontroller respectively connected to the output of the low-side analog front end and the output of the subtractor to receive the sampled analog voltage, the first switch and the second switch are controlled by the microcontroller according to the series or parallel connection between the first set of cells and the second set of cells.

5. The voltage sampling circuit as claimed in claim 4, further comprises a communication isolation circuit connecting a communication interface of the high-side analog front end to a communication interface of the microcontroller, wherein the communication isolation circuit communicates with the microcontroller through a second communication channel.

6. The voltage sampling circuit as claimed in claim 4, wherein the low-side analog front end communicates with the microcontroller through a first communication channel.

7. The voltage sampling circuit as claimed in claim 1, further comprises a total voltage sampling circuit, the total voltage sampling circuit is used for sampling the total voltage of at least two sets of cells in the battery pack, so as to judge whether the at least two sets of cells are connected in series or in parallel according to the sampling total voltage.

8. The voltage sampling circuit as claimed in claim 1, wherein at least three control switches are arranged between the first set of cells and the second set of cells to control the first set of cells and the second set of cells in series connection or in parallel connection.

9. A method for sampling voltage, comprising:
providing at least two analog front ends comprising a low-side analog front end connected to a first set of cells and a high-side analog front end connected to a second set of cells;
providing a subtractor for obtaining the analog voltage of the second set of cells connected to the high-side analog front end with respect to ground, the subtractor including:
a positive input end connected to the output of the high-side analog front end for receiving the analog voltage output by the high-side analog front end and a negative input end; and
connecting the negative input end of the subtractor to a total positive of the first set of cells when the first set of cells is connected with the second set of cells in series, and grounding the negative input end of the subtractor when the first set of cells is connected with the second set of cells in parallel.

10. The method for sampling voltage as claimed in claim 9, further comprising: providing a switch control circuit, the switch control circuit including a first switch connecting the total positive of the first set of cells with the negative input end of the subtractor when the first set of cells and the second set of cells are connected in series, and a second switch connecting the negative input end of the subtractor with the ground when the first set of cells is connected in parallel with the second set of cells.

* * * * *